(12) United States Patent
Hubris et al.

(10) Patent No.: US 9,459,956 B2
(45) Date of Patent: Oct. 4, 2016

(54) DATA DECODER WITH TRAPPING SET FLIP BIT MAPPER

(71) Applicant: SEAGATE TECHNOLOGY LLC, Cupertino, CA (US)

(72) Inventors: Alexander Hubris, Milpitas, CA (US); Zhengang Chen, Milpitas, CA (US); AbdelHakim S. Alhussien, Milpitas, CA (US); YingQuan Wu, Milpitas, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 278 days.

(21) Appl. No.: 13/958,162

(22) Filed: Aug. 2, 2013

(65) Prior Publication Data

US 2015/0026536 A1    Jan. 22, 2015

Related U.S. Application Data

(60) Provisional application No. 61/856,359, filed on Jul. 19, 2013.

(51) Int. Cl.
*G06F 11/10* (2006.01)
*H03M 13/00* (2006.01)
*H03M 13/11* (2006.01)

(52) U.S. Cl.
CPC ........ *G06F 11/1048* (2013.01); *H03M 13/114* (2013.01); *H03M 13/116* (2013.01); *H03M 13/1137* (2013.01); *H03M 13/1142* (2013.01); *H03M 13/1171* (2013.01); *H03M 13/658* (2013.01); *H03M 13/6561* (2013.01); *G06F 11/10* (2013.01); *H03M 13/1102* (2013.01); *H03M 13/1105* (2013.01)

(58) Field of Classification Search
CPC ............ H03M 13/1102–13/1197; G06F 11/10
USPC ........................ 714/746, 752, 758, 781, 785
See application file for complete search history.

(56) References Cited

U.S. PATENT DOCUMENTS

| | | |
|---|---|---|
| 4,584,681 A | 4/1986 | Singh et al. |
| 5,701,314 A | 12/1997 | Armstrong |
| 5,712,861 A | 1/1998 | Inoue |
| 6,407,953 B1 | 6/2002 | Cleeves |
| 6,438,717 B1 | 8/2002 | Butler |
| 6,657,803 B1 | 12/2003 | Ling |

(Continued)

OTHER PUBLICATIONS

J. Kang et al., "An Iterative Decoding Algorithm with Backtracking to Lower the Error Floors of LDPC Codes," IEEE Trans. on Communications, vol. 59, No. 1, pp. 64-73, 2011.

(Continued)

*Primary Examiner* — Albert Decady
*Assistant Examiner* — Christian Dorman
(74) *Attorney, Agent, or Firm* — Holland & Hart LLP

(57) ABSTRACT

A low density parity check decoder includes a variable node processor operable to generate variable node to check node messages and to calculate perceived values based on check node to variable node messages, a check node processor operable to generate the check node to variable node message vectors and to calculate checksums based on the variable node to check node messages, and a convergence detector and bit map generator operable to convergence of the perceived values and to generate at least one bit map that identifies variable nodes that are connected to check nodes with unsatisfied parity checks.

18 Claims, 7 Drawing Sheets

(56) References Cited

U.S. PATENT DOCUMENTS

| | | |
|---|---|---|
| 7,136,244 B1 | 11/2006 | Rothberg |
| 7,346,829 B2 | 3/2008 | Riho et al. |
| 7,702,989 B2 | 4/2010 | Graef |
| 7,730,384 B2 | 6/2010 | Graef |
| 7,738,201 B2 | 6/2010 | Jin |
| 7,971,125 B2 | 6/2011 | Graef |
| 7,990,642 B2 | 8/2011 | Lee |
| 8,145,981 B2 | 3/2012 | Mokhlesi et al. |
| 8,176,404 B2 | 5/2012 | Yang |
| 2008/0126908 A1 | 5/2008 | Lin |
| 2009/0282319 A1 | 11/2009 | No et al. |
| 2011/0060973 A1* | 3/2011 | Yang et al. .................. 714/799 |
| 2011/0080211 A1 | 4/2011 | Yang |
| 2011/0161633 A1 | 6/2011 | Xu |
| 2011/0246862 A1* | 10/2011 | Graef ........................... 714/785 |
| 2011/0264986 A1* | 10/2011 | Chin ................... H03M 13/114 714/763 |
| 2012/0200954 A1 | 8/2012 | Jin |
| 2012/0236429 A1 | 9/2012 | Yang |
| 2013/0028021 A1 | 1/2013 | Sharon et al. |
| 2013/0254622 A1 | 9/2013 | Kanno |
| 2014/0040700 A1* | 2/2014 | Kobori ............... H03M 13/1102 714/763 |
| 2014/0229792 A1* | 8/2014 | Varnica et al. ............... 714/759 |
| 2015/0128006 A1 | 5/2015 | Alhussien et al. |

OTHER PUBLICATIONS

Olmos et al., "Tree-Structure Expectation Propagation for LDPC Decoding in Erasure Channels", Cornell University Library arXiv:1009.4287 (Sep. 22, 2010).
U.S. Appl. No. 13/490,849, Unpublished filed Jun. 7, 2012 (Johnson Yen).
U.S. Appl. No. 13/465,214, Unpublished filed May 7, 2012 (Chung-Li Wang).
U.S. Appl. No. 13/445,858, Unpublished filed Apr. 12, 2012 (Johnson Yen).
U.S. Appl. No. 13/459,282, Unpublished filed Apr. 30, 2012 (Fan Zhang).
U.S. Appl. No. 13/412,492, Unpublished filed Mar. 5, 2012 (Shaohua Yang).
U.S. Appl. No. 13/326,367, Unpublished filed Dec. 15, 2011 (Shaohua Yang).
U.S. Appl. No. 13/326,363, Unpublished filed Dec. 15, 2011 (Fan Zhang).
U.S. Appl. No. 13/372,600, Unpublished filed Feb. 14, 2012 (Shaohua Yang).
U.S. Appl. No. 13/483,982, Unpublished filed May 30, 2012 (Yang Han).
U.S. Appl. No. 13/474,672, Unpublished filed May 17, 2012 (Fan Zhang).
U.S. Appl. No. 13/560,737, Unpublished filed Jul. 27, 2012 (Weijun Tan).
U.S. Appl. No. 13/602,440, Unpublished filed Sep. 4, 2012 (Fan Zhang).
U.S. Appl. No. 13/644,542, Unpublished filed Oct. 4, 2012 (Shaohua Yang).
U.S. Appl. No. 13/644,589, Unpublished filed Oct. 4, 2012 (Shaohua Yang).
U.S. Appl. No. 13624927, Unpublished filed Sep. 22, 2012 (Shaohua Yang).
U.S. Appl. No. 13645838, Unpublished filed Oct. 5, 2012 (Chung-Li Wang).
U.S. Appl. No. 13/777,381, Unpublished filed Feb. 26, 2013 (Shaohua Yang).
U.S. Appl. No. 13/708,941, Unpublished filed Dec. 8, 2012 (Anatoli A. Bolotov).
U.S. Appl. No. 13/611,158, Unpublished filed Sep. 12, 2012 (Yang Han).

* cited by examiner

DATA DECODER WITH TRAPPING SET FLIP BIT MAPPER

CROSS REFERENCE TO RELATED APPLICATIONS

The present application claims priority to (is a non-provisional of) U.S. Pat. App. No. 61/856,359, entitled "Data Decoder With Trapping Set Flip Bit Mapper", and filed Jul. 19, 2013 by Hubris et al, the entirety of which is incorporated herein by reference for all purposes.

FIELD OF THE INVENTION

Various embodiments of the present invention provide systems and methods for processing data, and more particularly to systems and methods for a decoder which generates trapping set flip bit maps after decoding failures.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, parity bits can be added to groups of data bits, ensuring that the groups of data bits (including the parity bits) have either even or odd numbers of ones. The parity bits may be used in error correction systems, including in Low Density Parity Check (LDPC) decoders. When errors are not corrected with normal error correction procedures, retry features may be needed to correct stubborn errors.

BRIEF SUMMARY

Embodiments of the present invention provide a low density parity check decoder including a variable node processor operable to generate variable node to check node messages and to calculate perceived values based on check node to variable node messages, a check node processor operable to generate the check node to variable node message vectors and to calculate checksums based on the variable node to check node messages, and a convergence detector and bit map generator operable to convergence of the perceived values and to generate at least one bit map that identifies variable nodes that are connected to check nodes with unsatisfied parity checks.

This summary provides only a general outline of some embodiments according to the present invention. Many other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Embodiments of the present invention are related to a layered low density parity check decoder which generates bit maps based on the syndrome after a decoding failure. The bit maps provide candidates for bit flipping and re-decoding during retry operations, in order to mitigate the decoding error floor caused by trapping sets. In some embodiments, syndrome update hardware in the low density parity check decoder is used for both normal decoding and for bit map generation, minimizing the circuit area impact of the bit map generation. The bit map generation is also fast and flexible, allowing a variety of combinations for different error floor mitigation algorithms.

Low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

A low density parity check code is defined by a sparse parity check matrix H of size m×n, where m<n. A code word c of length n satisfies all the m parity check equations defined by H, i.e., $cH^T=0$, where 0 is a zero vector. Low density parity check codes are Shannon capacity approaching as n increases. In addition, low density parity check codes are relatively friendly to highly parallel decoder implementation. In practical applications, structured low density parity check codes may be used to simplify implementation. Some embodiments use a quasi-cyclic low density parity check (QC-LDPC) code, which can be defined by a parity check matrix composed of circulant sub-matrices of size q×q. In a binary case, a circulant matrix (also called a circulant) is an identity matrix in which all rows (or columns) are cyclically shifted by a fixed amount. For example, if q=4, the following binary circulant $$\begin{bmatrix} 0 & 1 & 0 & 0 \\ 0 & 0 & 1 & 0 \\ 0 & 0 & 0 & 1 \\ 1 & 0 & 0 & 0 \end{bmatrix} \quad \text{(Eq 1)}$$

is an identity matrix cyclically shifted to the right by 1. For a quasi-cyclic low density parity check code, the parity check matrix can be written in the form of a base matrix $H_b$, in the following form:

$$H_b = \begin{bmatrix} H_{11} & \cdots & H_{1N} \\ \vdots & \ddots & \vdots \\ H_{M1} & \cdots & H_{MN} \end{bmatrix} \quad \text{(Eq 2)}$$

where $H_{ij}$ is either a circulant of size q×q or a zero matrix, and qM=m, qN=n.

Figure 1:
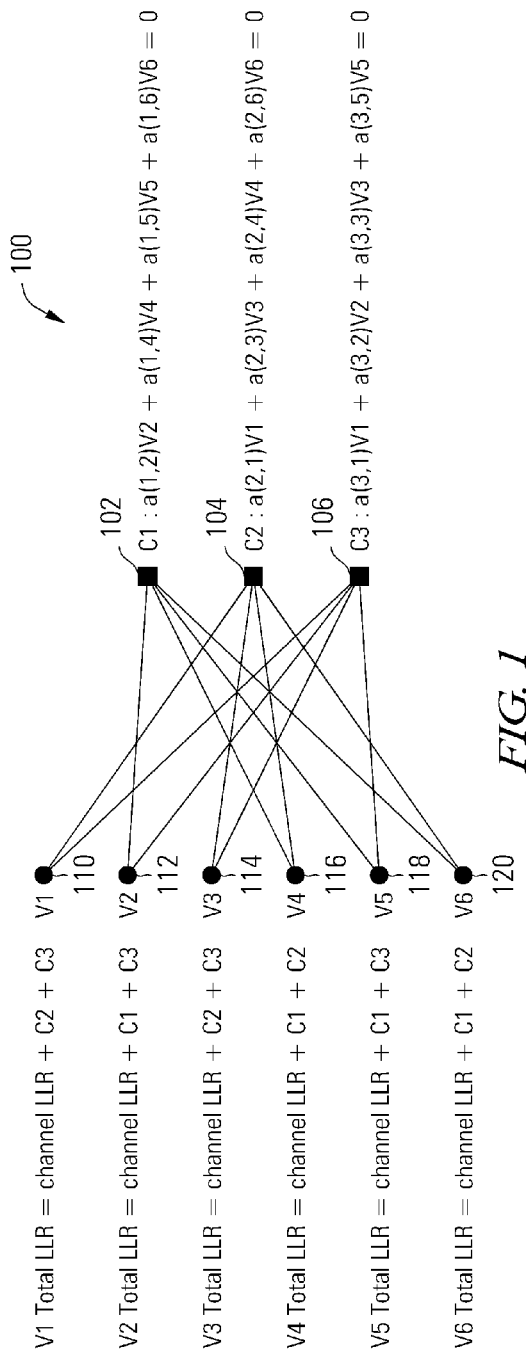
FIG. 1 depicts a Tanner graph of a simplified low density parity check code that may be decoded in a low density parity check decoder with a trapping set flip bit mapper in accordance with some embodiments of the present invention.

Low density parity check codes are also known as graph-based codes with iterative decoding algorithms, which can be visually represented in a Tanner graph 100 as illustrated in FIG. 1. In a low density parity check decoder, multiple parity checks are performed in a number of check nodes 102, 104 and 106 for a group of variable nodes 110, 112, 114, 116, 118, and 120. The connections (or edges) between variable nodes 110-120 and check nodes 102-106 are selected as the low density parity check code is designed, balancing the strength of the code against the complexity of the decoder required to execute the low density parity check code as data is obtained. The number and placement of parity bits in the group are selected as the low density parity check code is designed. Messages are passed between connected variable nodes 110-120 and check nodes 102-106 in an iterative process, passing beliefs about the values that should appear in variable nodes 110-120 to connected check nodes 102-106. Parity checks are performed in the check nodes 102-106 based on the messages and the results are returned to connected variable nodes 110-120 to update the beliefs if necessary. Low density parity check decoders may be implemented in binary or non-binary fashion. In a binary low density parity check decoder, variable nodes 110-120 contain scalar values based on a group of data and parity bits that are retrieved from a storage device, received by a transmission system or obtained in some other way. Messages in the binary low density parity check decoders are scalar values transmitted as plain-likelihood probability values or log likelihood ratio (LLR) values representing the probability that the sending variable node contains a particular value. In a non-binary low density parity check decoder, variable nodes 110-120 contain symbols from a Galois Field, a finite field $GF(p^k)$ that contains a finite number of elements, characterized by size $p^k$ where p is a prime number and k is a positive integer. Messages in the non-binary low density parity check decoders are multi-dimensional vectors, generally either plain-likelihood probability vectors or log likelihood ratio vectors.

The connections between variable nodes 110-120 and check nodes 102-106 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} 0 & a(1,2) & 0 & a(1,4) & a(1,5) & a(1,6) \\ a(2,1) & 0 & a(2,3) & a(2,4) & 0 & a(2,6) \\ a(3,1) & a(3,2) & a(3,3) & 0 & a(3,5) & 0 \end{bmatrix} \quad \text{(Eq 3)}$$

For example, in some embodiments of a GF(4) decoder with circulant size 4, each Galois field element a(i,j) specifies a shift for the corresponding circulant matrix of 0, 1, 2 or 3.

By providing multiple check nodes 102-106 for the group of variable nodes 110-120, redundancy in error checking is provided, enabling errors to be corrected as well as detected. Each check node 102-106 performs a parity check on bits or symbols passed as messages from its neighboring (or connected) variable nodes. In the example low density parity check code corresponding to the Tanner graph 100 of FIG. 1, check node 102 checks the parity of variable nodes 112, 116, 118 and 120. Values are passed back and forth between connected variable nodes 110-120 and check nodes 102-106 in an iterative process until the low density parity check code converges on a value for the group of data and parity bits in the variable nodes 110-120, or until a maximum number of iterations is reached. For example, variable node 110 passes messages to check nodes 104 and 106, referred to herein as variable node to check node messages or V2C messages. Check node 102 passes messages back to variable nodes 112, 116, 118 and 120, referred to herein as check node to variable node messages or C2V messages. The messages between variable nodes 110-120 and check nodes 102-106 are probabilities or beliefs, thus the low density parity check decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-120 and check nodes 102-106, with the values in the nodes 102-120 being adjusted based on the messages that are passed, until the values converge and stop changing or until a maximum number of iterations is reached.

Decoder convergence is checked by determining whether the syndrome $s=cH^T$ is all zero. The syndrome is a vector of length m, with each bit corresponding to a parity check. A zero bit in a syndrome means the check is satisfied, while a non-zero bit in the syndrome is an unsatisfied check (USC). By definition, a codeword has syndrome $s=0$. A non-codeword has a non-zero syndrome.

Though low density parity check codes are capacity approaching codes, this usually refers to their performance in the "waterfall" region if the decoded error rate is plotted as a function of signal to noise ratio (SNR). Low density parity check decoding performance is subject to a behavior called "error floor", which refers the phenomenon that the performance curve bends or flattens out at the higher signal to noise region, causing trapping sets. A trapping set contains a small number of variable nodes, and their induced sub-graph has a small number of odd-degree check nodes. When the bits in a trapping set are in error, i.e., having the messages with wrong signs, a small number of check nodes become unsatisfied (USC), and the iterative decoding algorithm may not correct the errors even after a large number of iterations.

Figure 2:
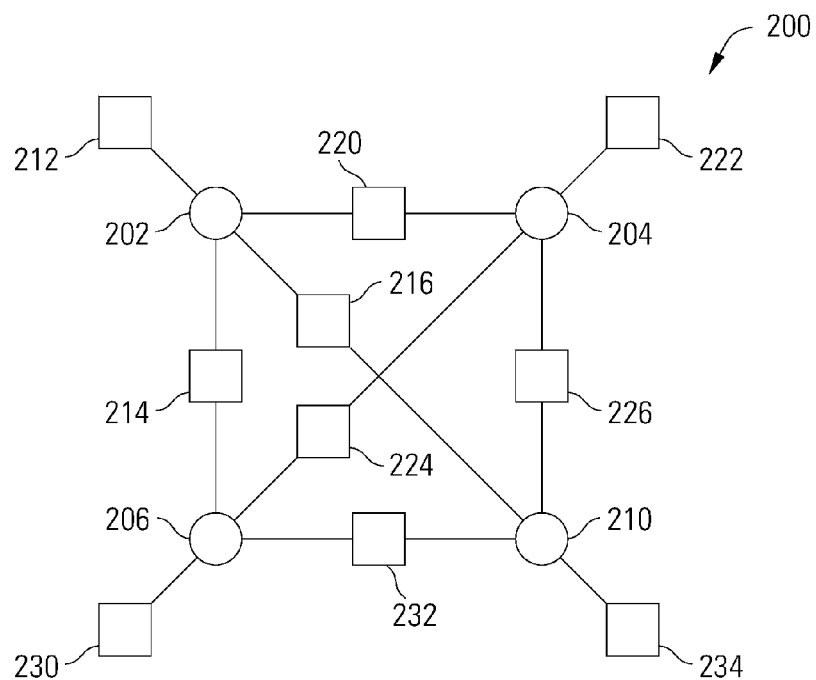
FIG. 2 depicts an example trapping set in a low density parity check code that can be processed by a low density parity check decoder with a trapping set flip bit mapper in accordance with some embodiments of the present invention.

Turning to FIG. 2, a simple trapping set 200 in a low density parity check code is depicted to illustrate how errors can be trapped during decoding. (Note that the number of connected variable nodes and check nodes, and the number of connections for each variable node and check node, is merely an example and may not be applicable to every low density parity check code or every low density parity check decoder.) The example trapping set 200 includes four variable nodes 202, 204, 206 and 210. Variable node 202 is connected to four check nodes 212, 214, 216 and 220. Variable node 204 is connected to four check nodes 220, 222, 224 and 226. Variable node 206 is connected to four check nodes 214, 224, 230 and 232. Variable node 210 is connected to four check nodes 216, 226, 232 and 234.

Variable nodes 202, 204, 206 and 210 form a trapping set 200. If all four variable nodes 202, 204, 206 and 210 have errors in their bit or symbol values, these errors will tend to be trapped. Check nodes 214, 216, 220, 224, 226 and 232 are connected only to variable nodes 202, 204, 206 and 210 within the trapping set 200. The parity checks performed by these check nodes 214, 216, 220, 224, 226 and 232 may pass even if the values in the variable nodes 202, 204, 206 and 210 are incorrect. For example, if both variable nodes 202 and 206 contain erroneous bit values of 0 instead of correct bit values of 1, the parity check performed in check node 214 will pass because both inputs from variable nodes 202 and 206 are incorrect. Similarly, if both variable nodes 202 and 210 contain incorrect values, the parity check performed in check node 216 will pass.

If majority rules voting or similar systems are used to reconcile the parity checks for a particular variable node in the trapping set 200, the error is trapped rather than corrected. For example, if check nodes 214, 224 and 232 all incorrectly report that variable node 206 contains the correct data value, the variable node 206 will maintain the incorrect data value, even if check node 230 reports that it is an error based on other variable nodes (not shown) that are connected to check node 230. In other words, even if the parity check performed in check node 230 fails because the error in variable node 206 does not combine with values from other variable nodes (not shown) connected to check node 230 to pass the parity check, the error report from check node 230 will be overruled by the mistaken reports from check nodes 214, 224 and 232 indicating that variable node 206 is correct. Again, trapping set 200 is only an example, and the bit mapping disclosed herein is not limited to use with any particular low density parity check codes or conditions.

By generating a bit map of variable nodes connected to unsatisfied parity checks, error recovery or retry schemes may be implemented in the low density parity check decoder based on the bit map, such as targeted symbol flipping of variable nodes in the bit map, bit selective scaling (BSS), extrinsic log likelihood ratio adjusting or parity forcing, locally maximum-likelihood (ML) decoding, dynamic low density parity check scaling/offset, etc. Such error recovery schemes may be performed in the low density parity check decoder or in surrounding system components, such as in the output of an upstream data detector that provides the input to the low density parity check decoder. (Notably, the term "bit map" used herein does not indicate that the low density parity check decoder is limited to a binary decoder, but also encompasses the use of non-binary symbol-based decoders.)

Given an unsatisfied check in the syndrome vector, all the connected variable nodes can be found by considering the row in H of the unsatisfied check (or unsatisfied check row) and finding the $d_c$, column indices of all non-zero bits in the row, which correspond to connections between each variable node and the unsatisfied check node. By repeating this procedure for all unsatisfied parity checks, the union of all such column indices is the set of candidate bit locations.

Figure 3:
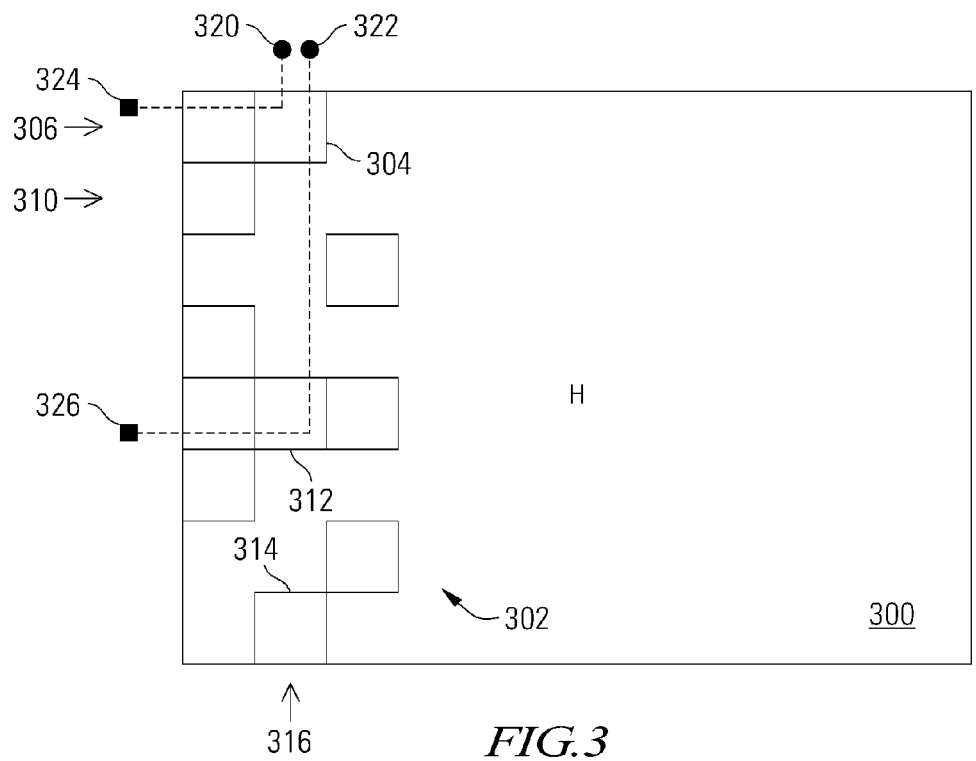
FIG. 3 depicts an H matrix with some circulant sub-matrices in which bit mapping is performed on a circulant basis by a quasi-cyclic low density parity check decoder in accordance with some embodiments of the present invention.

In some embodiments, rather than processing H row by row and unionizing the results for all the unsatisfied check rows processed, the bit mapping is performed on a circulant basis for a quasi-cyclic low density parity check decoder as shown in FIG. 3. In the example H matrix 300 illustrated in FIG. 3, only some circulant matrices 302 are shown for clarity.

All non-zero circulants (e.g., 304) in a given row (e.g., 306) are processed, then the process proceeds to the next row (e.g., 310). Processing a q×q circulant (e.g., 304) involves finding all non-zero circulants (e.g., 304, 312, 314) in the same column (e.g., 316) and which ones of the q variable nodes (e.g., 320, 322 (corresponding to a column in the circulant) are connected to one or more unsatisfied parity checks (e.g., 324, 326). Each of the variable nodes connected to unsatisfied parity checks is added to the bit map. One benefit of this is that the order of processing is the same as in a layered decoder architecture, where the message passing is also done circulant by circulant. Therefore, much of the decoder control logic can be re-used for error floor mitigation.

The bit map is used to indicate whether a bit is a candidate for flipping in some embodiments, or in other retry features in some embodiments. For example, considering a column i, the q-bit map vector is $e_i$ of size 1×q, where an element with value 1 in the vector indicates that the corresponding variable node is a candidate for flipping, while an element with value 0 indicates the corresponding variable node is not a candidate for flipping. The vector $e_i$ is calculated in some embodiments according to the following equation:

$$e_i = \bigvee_{j=1}^{M} s_j H_{ji} \quad \text{(Eq 4)}$$

where $s=[s_1, s_2, \ldots, s_M]$ is the syndrome vector and $H_{ji}$ is the q×q circulant sub-matrix. Given the sparse nature of the H matrix in some embodiments, the OR operation of M components can be written as an OR operation of $d_v$ components that consist of non-zero circulants, according to the following equation:

$$e_i = \bigvee_{k=1}^{d_v} s_k H_{ki} \quad \text{(Eq 5)}$$

Because $H_{ki}$ is a circulant, the vector matrix multiplication is simply a shift operation of $s_k$. The derivation used to calculate $e_i$ can be easily extended to more general cases. For example, to generate a bit map $e_i$ in which each non-zero bit indicates a variable node connected to exactly two unsatisfied checks, the following logic can be used:

$$e_i = (a_1 == 2), \text{ where } a_i = \sum_{k=1}^{d_v} s_k H_{ki} \quad \text{(Eq 6)}$$

where $a_i=[a_{i1}, a_{i2}, \ldots, a_{iq}]$ is a sum vector with $a_{ij}$ indicating the number of unsatisfied checks connected to variable node j in column i.

Figure 4:
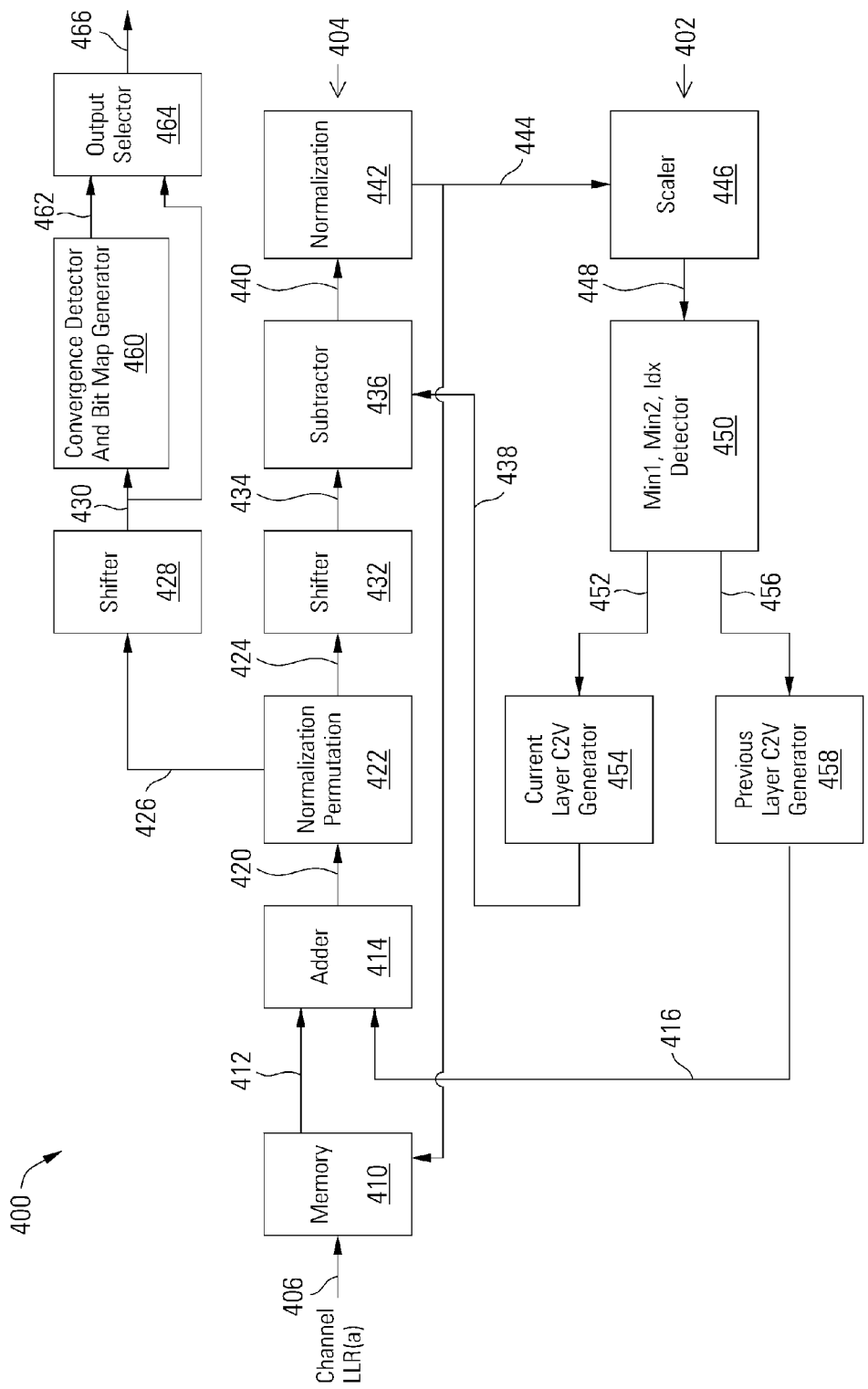
FIG. 4 depicts a low density parity check decoder with bit mapping in accordance with some embodiments of the present invention.

Turning to FIG. 4, a layered low density parity check decoder 400 with bit mapping is illustrated in block-diagram form in accordance with some embodiments of the present invention. The low density parity check decoder 400 generates check node to variable node messages from a min-sum based check node unit 402 to a variable node processor 404, and may be either a binary or multi-level decoder. Incoming log likelihood ratio values for data to be decoded are received at input 406 and stored in a memory 410. The memory 410 stores soft log likelihood ratio input values from the input 406 and Q values of each symbol, representing the likelihood that an input symbol has the value of each element of the Galois Field. In some embodiments of a GF(4) low density parity check decoder, the Q values consist of one hard decision and three soft log likelihood ratio values, or four soft log likelihood ratio values in an equivalent but alternative format.

The memory 410 yields stored Q values 412 or $Q_n(a)$ for the layer previous to the layer currently being processed, also referred to herein as the previous layer and the connected layer. An adder 414 adds the Q values 412 to previous layer check node to variable node messages 416 or $R_{1,n}(a)$ in array fashion to produce S messages 420 or $S_n(a)$ containing total soft log likelihood ratio values for the previous layer. Again, columns in the H matrix represent variable nodes, and by adding all the non-zero entries in a column, the connected variable nodes are added to yield the input to a check node.

The S messages 420 are provided to a normalization and permutation circuit 422, which converts the format of the S messages 420 from four soft log likelihood ratio values to the equivalent content but different format of one hard decision and three soft log likelihood ratio values (for a GF(4) embodiment), and which applies a permutation to rearrange the variable node updated values to prepare for the check node update and to apply the permutations specified by the non-zero elements of the H matrix. For example, in a GF(4) embodiment, the four elements 0-3 of the Galois Field are 0, 1, $\alpha$, $\alpha^2$. The permutation applied by normalization and permutation circuit 422 is a multiplication in the Galois Field. Element 2 ($\alpha$) multiplied by element 1 (1) equals $\alpha \times 1$ or $\alpha$, which is element 2. Similarly, element $2 \times 2 = \alpha \times \alpha = \alpha^2$, which is element 3. Element $2 \times 3 = \alpha \times \alpha^2 = 1$, which is element 1. Thus, element 2 multiplied by 1, 2 and 3 results in elements 2, 3, and 1, which are permutations of elements 1, 2 and 3. The normalization and permutation circuit 422 yields P messages 424 or $P_n(a)$ for the previous layer.

The P messages 424 from the normalization and permutation circuit 422 are provided to a shifter 432, a cyclic shifter or barrel shifter which shifts the symbol values in the normalized log likelihood ratio P messages 424 to generate the next circulant sub-matrix, yielding current layer P messages 434 which contain the total soft log likelihood ratio values of the current layer.

The current layer P messages 434 are provided to a subtractor 436 which subtracts the current layer check node to variable node messages 438, or $R_{2,n}(a)$, from the current layer P messages 434, yielding D messages 440, or $D_n(a)$. The current layer check node to variable node messages 438 are old values for the current layer, generated during a previous decoding iteration. Generally, the vector message from a check node to a variable node contains the probabilities for each symbol d in the Galois Field that the destination variable node contains that symbol d, based on the prior round variable node to check node messages from neighboring variable nodes other than the destination variable node. The inputs from neighboring variable nodes used in a check node to generate the check node to variable node message for a particular neighboring variable node are referred to as extrinsic inputs and include the prior round variable node to check node messages from all neighboring variable nodes except the particular neighboring variable node for which the check node to variable node message is being prepared, in order to avoid positive feedback. The check node prepares a different check node to variable node message for each neighboring variable node, using the different set of extrinsic inputs for each message based on the destination variable node. Subtracting the current layer check node to variable node messages 438 from an earlier iteration removes the intrinsic input, leaving only the extrinsic inputs to generate a check node to variable node message for a variable node.

D messages 440 are provided to a normalization circuit 442 which converts the format of the D messages 440 from four soft log likelihood ratio values to the equivalent content but different format of one hard decision and three soft log likelihood ratio values, yielding new Q messages 444, or $Q_{2,n}(a)$, also referred to as variable node to check node messages, for the current layer. The Q messages 444 are stored in memory 410, overwriting previous channel or calculated values for the current layer, and are also provided to a scaler 446 which scales the Q messages 444 to yield scaled variable node to check node messages 448, or $T_{2,n}(a)$.

Variable node to check node messages 448 are provided to a min finder circuit 450 which calculates the minimum value $min_1(d)$, the second or next minimum value $min_2(d)$ and the index of the minimum value idx(d). The min finder circuit 450 also calculates the signs of the variable node to check node messages 448 and tracks the sign value of each non-zero element of the H matrix and the cumulative sign for the current layer. The min finder circuit 450 yields the current layer minimum, next minimum and index values with the sign values 452 to a current layer check node to variable node message generator 454, which calculates the current layer check node to variable node messages 438, or $R_{2,n}(a)$. The min finder circuit 450 also yields the previous layer minimum, next minimum and index values with the sign values 456 to a previous layer check node to variable node message generator 458, which calculates the previous layer C2V messages 416, or $R_{1,n}(a)$. The current layer check node to variable node message generator 454 and previous layer check node to variable node message generator 458 generate the check node to variable node messages or R messages 438 and 416 based on the final state and current column index of the symbol. If the current column index is equal to the index of the minimum value, then the value of R is the second minimum value. Otherwise, the value of R is the minimum value of that layer. The sign of R is the XOR of the cumulative sign and the current sign of the symbol.

The variable node processor 404 and the check node unit 402 thus operate together to perform layered decoding of non-binary or multi-level data. The variable node processor 404 generates variable node to check node messages (V2C messages) and calculates perceived values based on check node to variable node messages (C2V messages). The check node unit 402 generates check node to variable node messages and calculates checksums based on variable node to check node messages, using a min finder circuit 450 operable to identify a minimum, a next minimum and an index of minimum value in the variable node to check node messages.

Normalization and permutation circuit 422 also yields soft log likelihood ratio values 426 which are provided to a cyclic shifter 428. Cyclic shifter 428 rearranges the soft log likelihood ratio values 426 to column order, performs a barrel shift which shifts the normalized soft log likelihood ratio values 426 from the previous layer to the current layer, and which yields hard decisions 430 or $a_n^*$, calculated as $argmin_a S_n(a)$.

The hard decisions 430 are provided to a convergence detector and bit map generator 460, which calculates the syndrome $s=cH^T$ and determines whether the syndrome is 0 and thus, whether the data converged to a codeword. The convergence detector and bit map generator 460 also generates a bit map in which a bit with value 1 indicates that the corresponding variable node is a candidate for flipping, while a bit with value 0 indicates the corresponding variable node is not a candidate for flipping. In some embodiments, the bit map identifies a variable node as a candidate for flipping if at least one connected check node fails the parity check. In some embodiments, the bit map identifies a variable node as a candidate for flipping if two or more connected check nodes fail the parity check. In some embodiments, multiple bit maps are generated by the convergence detector and bit map generator 460, each generated based on a different criterion for the number of connected check nodes which fail the parity check. For example, in a decoder for a low density parity check code of column weight 4, for which each variable node is connected to four check nodes, different bit maps can be generated for each of the possible numbers of failed connected parity checks, 1, 2, 3 or 4, and for combinations thereof, such as greater than 1, greater than 2, etc.

The bit maps may have any suitable format. Based upon the disclosure provided herein, one of ordinary skill in the art will recognize a variety of bit map formats that could be generated by convergence detector and bit map generator 460. For example, in some embodiments, the bit map may be provided as a series of bit map vectors $e_i$ calculated according to equations 4, 5 or 6 above or variations thereof, with the bit map vectors corresponding to the circulant currently being processed. In some embodiments, the bit map may be provided as an array of bit values corresponding to the entire circulant currently being processed. In some embodiments, the bit map may be provided as an array of bit values corresponding to the entire H matrix.

In some embodiments, an output selector 464 is provided which receives the bit map 462 from the convergence detector and bit map generator 460 and the hard decisions 430 from the shifter 428, and which selectably provides either the bit map 462 or the hard decisions 430 at output 466. The output selector 464 may comprise any suitable selector circuitry, such as a multiplexer array adapted to the format of the bit map 462 and the format of the hard decisions 430. Based upon the disclosure provided herein, one of ordinary skill in the art will recognize a variety of circuits that may be included in output selector 464. In some embodiments, the output selector 464 includes a memory to aggregate bit map vectors $e_i$ generated by convergence detector and bit map generator 460 to form an aggregate bit map vector for the column of the H matrix to be yielded at output 466. For example, if the circulant sub-matrices are 128×128 bits, and there are 23 rows in the H matrix, a memory in some embodiments of the output selector 464 is a 2944 bit register, corresponding to the 23 rows×128 bits.

Figure 5:
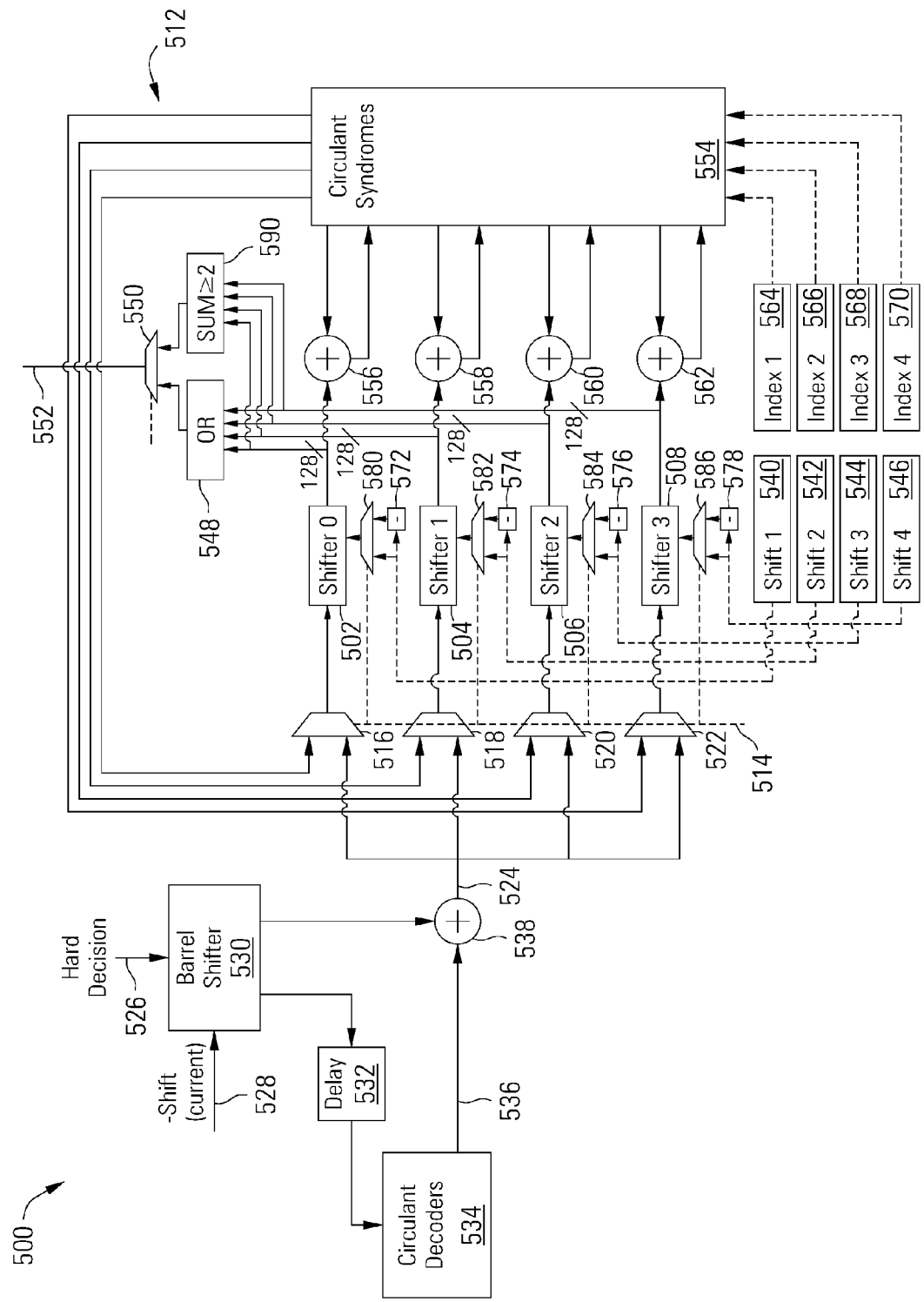
FIG. 5 depicts a convergence check and bit map circuit in accordance with some embodiments of the present invention.

Turning to FIG. 5, a convergence detector and bit map generator 500 is disclosed in accordance with some embodiments of the invention, suitable for use in place of convergence detector and bit map generator 460 in some embodiments. The convergence detector and bit map generator 500 operates in circulant-wise fashion. The convergence detector and bit map generator 500 uses a set of barrel shifters 502, 504, 506, 508 in a shared fashion to either calculate the syndrome based on the hard decisions 510 or to generate the bit map using a loopback of the circulant syndrome or parity values 512, depending on the value of a control signal 514. The control signal 514 sets a number of switches or multiplexers 516, 517, 520, 522 to either provide hard decision data 524 or syndrome data 512 to the barrel shifters 502, 504, 506, 508. The convergence detector and bit map generator 500 shown in FIG. 5 is adapted for use with a low density parity check code of column weight 4, thus including four barrel shifters 502, 504, 506, 508. Other embodiments may be adapted to other column weights and may include different numbers of barrel shifters.

When control signal 514 selects a convergence check mode, the multiplexers 516, 517, 520, 522 provide hard decision data 524 to the barrel shifters 502, 504, 506, 508. The hard decisions 526 for the current circulant are shifted by the reverse of a current shift amount 528 in a barrel shifter 530. For example, if the circulant size is 128 and the current shift amount is 5, the reverse shift is 128−5 or 123. The reverse shifted hard decisions are delayed in delay circuit 532 and processed in circulant decoders 534 to yield the previous hard decisions 536 for the current circulant. If there are, for example, 159 columns in the H matrix, there will be 159 decoders in circulant decoders 534. The previous hard decisions 536 are combined with the reverse shifted hard decisions from barrel shifter 530 in an XOR operation 538 to yield a difference as hard decision data 524, which has a value of 1 if the hard decision changed between iterations and a value of 0 if the hard decision did not change. Thus, the convergence detector and bit map generator 500 can determine whether data has converged by determining if any of the hard decisions changed from one local decoding iteration to the next. The convergence detector and bit map generator 500 can detect changes in hard decisions from one iteration to the next in any suitable manner. Based upon the disclosure provided herein, one of ordinary skill in the art will recognize a variety of circuits that may be used in or in place of barrel shifter 530, delay circuit 532, circulant decoders 534 and XOR gates 538.

The differences of hard decision data 524 are shifted in barrel shifters 502, 504, 506, 508 by shift amounts adapted based on the connected circulants for the current circulant being processed, with the shift amounts provided by shift memories 540, 542, 544, 546. The differences of hard decision data 524 are passed to barrel shifters 502, 504, 506, 508 through multiplexers 516, 518, 520, 522 by control signal 514 during the convergence check mode. The shifted differences from barrel shifters 502, 504, 506, 508 are also used to update a circulant syndrome memory 554 by XOR-ing them with previous syndrome values from circulant syndrome memory 554 in read-modify-write operations using XOR gates 556, 558, 560, 562. The circulant syndrome memory 554 stores parity results for each row separately in some embodiments. For example, given an H matrix with 23 rows and 128×128 bit circulants, the circulant syndrome memory 554 stores 128 bits for each of the 23 rows. In a column weight 4 decoder, four syndrome values are selected when processing a given circulant, as selected by circulant indices from circulant index memories 564, 566, 568, 570. Thus, during normal decoding, the parity results are stored in circulant syndrome memory 554.

Once normal decoding is complete, either when the data converges (all bits of the syndrome are 0), or after a maximum number of local decoding iterations in the decoder have been performed, another local iteration is performed to generate the bit map or bit maps in convergence detector and bit map generator 500, without decoding, that is, without updating Q values in the variable node processor. During this local iteration, the control signal 514 selects a bit map generation mode, and the multiplexers 516, 517, 520, 522 provide syndrome data 512 to the barrel shifters 502, 504, 506, 508 as part of a syndrome loopback circuit. During the bit map generation, the parity values from circulant syndrome memory 554 are shifted in barrel shifters 502, 504, 506, 508 by reverse shift amounts from shift memories 540, 542, 544, 546, with the reverse shift calculated in subtractor circuits 572, 574, 576, 578 by subtracting the shift amounts from the circulant size. Thus, the shift performed in barrel shifters 502, 504, 506, 508 is a normal shift when processing hard decisions to calculate the syndrome (using bits to update the syndrome), and is a reverse shift or negative shift when generating the bitmap (using the syndrome to update bits). Multiplexers 580, 582, 584, 586 select the shift amounts during syndrome generation mode and the reverse shift amounts during bit map generation mode.

The bit map is calculated from the shifted parity values from circulant syndrome memory 554 in appropriate logic circuits for the desired bit map. For a bit map in which a bit is set to 1 when any parity checks connected to the variable node associated with the bit failed, OR gates 548 are used to combine the parity checks for the check nodes connected to the current variable node. For a bit map in which a bit is set to 1 when two or more parity checks connected to the variable node associated with the bit failed, an adder and comparator circuit 590 adds the unsatisfied parity checks for the check nodes connected to the current variable node and compares the sum with the value 2. As disclosed above, any number of bit maps with different criterion may be generated, outputting one or more different bit maps with switches or multiplexers (e.g., 550). Thus, after decoding fails, meaning that there are unsatisfied checks or non-zero syndrome bits, the convergence detector and bit map generator 500 can be used to generate one or more bit maps that identify the variable nodes that are connected to the unsatisfied parity checks as candidates for retry operations such as, but not limited to, bot or symbol flipping and re-decoding operations. Again, in some bit maps, the bit in the bit map for every variable node connected to one unsatisfied check is set to 1. In other bit maps, the bit in the bit map for every variable node connected to two or more unsatisfied checks is set to 1. Yet other bit map logic can be used, for example generating a bit map in which the bit for every variable node connected to three or more unsatisfied checks is set to 1.

Figure 6:
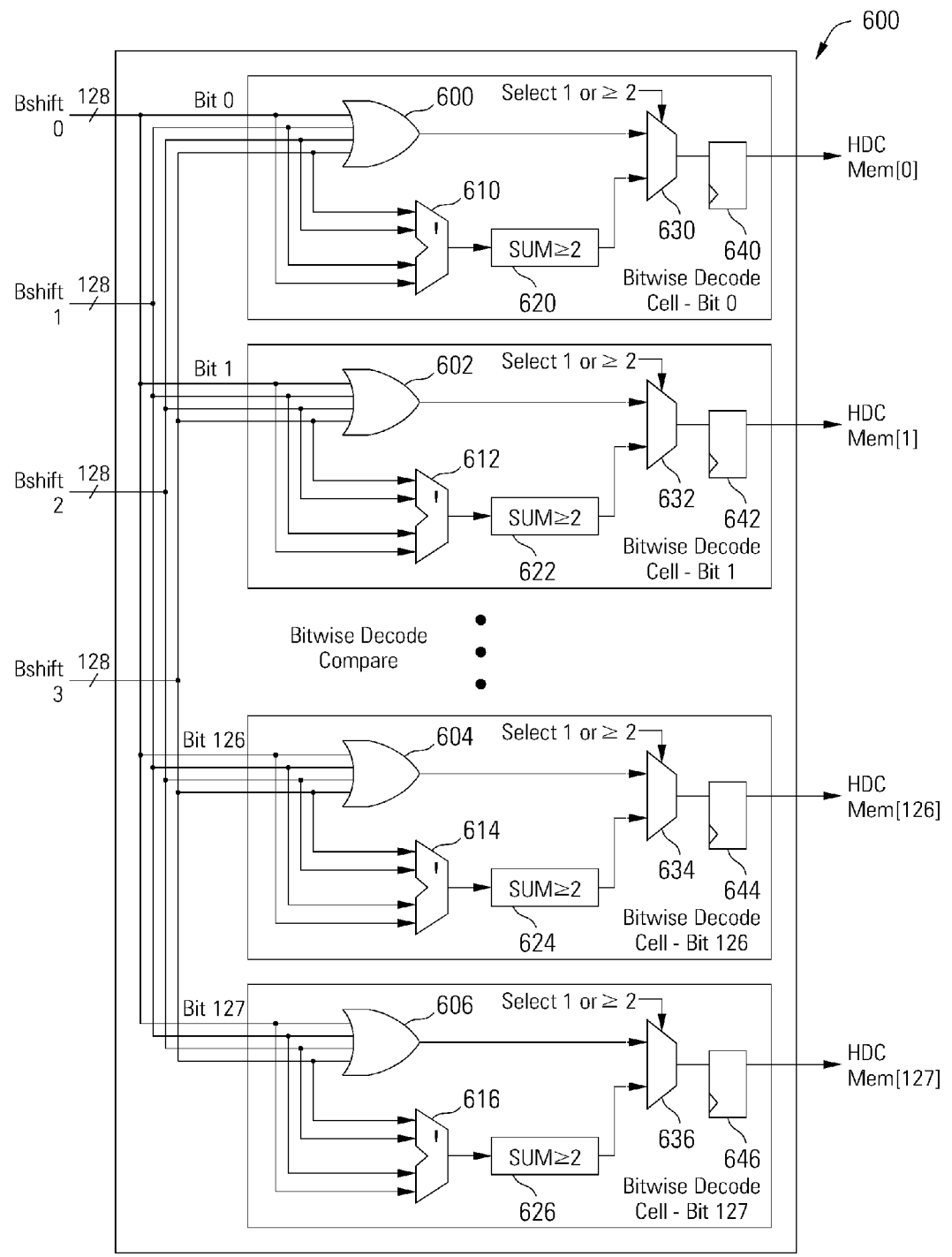
FIG. 6 depicts a diagram of convergence check and bit map logic in a convergence check and bit map circuit in accordance with some embodiments of the present invention.

Turning to FIG. 6, the bit map logic of OR gate 548 and adder and comparator circuit 590 is shown in more detail according to some embodiments of the invention. The OR gates 548 that process four 128 bit inputs include an array of 128 bitwise OR gates 600, 602, 604, 606, each with four 1-bit inputs and with 1-bit outputs. Bit 0 from barrel shifter 502 is connected to the first input of the first OR gate 600, bit 1 from barrel shifter 502 is connected to the first input of the second OR gate 602, and so on, with bit 127 from barrel shifter 502 connected to the first input of the 128'th OR gate 606. Bit 0 from barrel shifter 504 is connected to the second input of the first OR gate 600, bit 1 from barrel shifter 504 is connected to the second input of the second OR gate 602, and so on, with bit 127 from barrel shifter 504 connected to the second input of the 128'th OR gate 606.

The adder and comparator circuit 590 that process four 128 bit inputs are similarly provided by an array of adders 610, 612, 614, 616 each with four 1-bit inputs and a 3-bit output, feeding an array of comparators 620, 622, 624, 626 each with a 3-bit input and a 1-bit output. The adders 610, 612, 614, 616 provide a sum representing how many of their four 1-bit inputs are asserted, from 0 to 4, and the comparators 620, 622, 624, 626 assert their 1-bit outputs if that sum is greater than or equal to two. Again, bit maps may be generated based on a variety of criteria, and are not limited to the one unsatisfied check bit map and the two or more unsatisfied checks bit map of FIGS. 5 and 6.

The 128-bit multiplexer 550 is provided by an array of multiplexers 630, 632, 634, 636 each having two 1-bit inputs and a 1-bit output, with the results buffered in pipeline registers 640, 642, 644, 646 in some embodiments.

Figure 7:
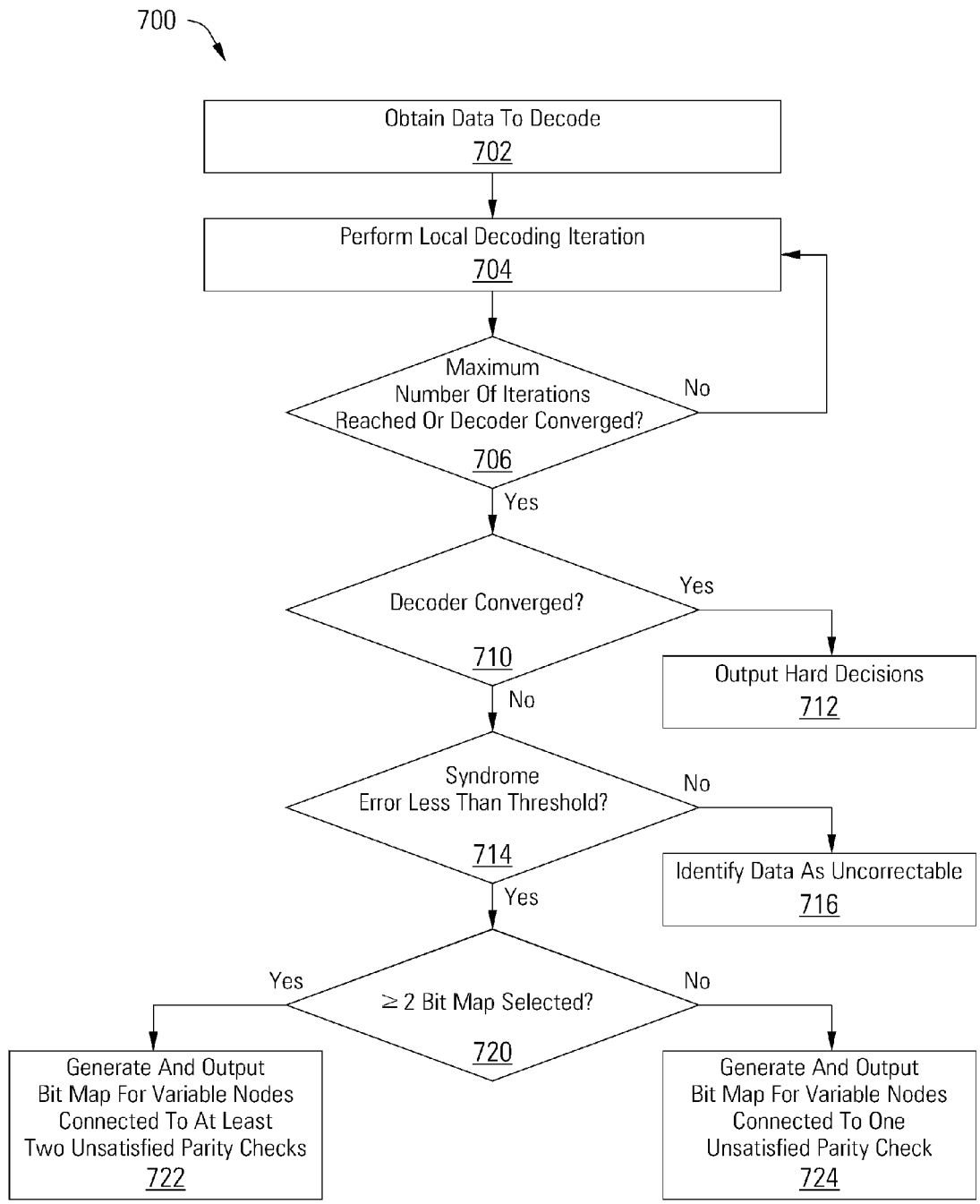
FIG. 7 depicts a flow diagram of an operation to generate a bit map based on unsatisfied parity checks in a data decoder in accordance with some embodiments of the present invention.

Turning to FIG. 7, a flow diagram 700 of a method for generating bit maps based on unsatisfied parity checks in a data decoder is depicted in accordance with some embodiments of the present invention. Following flow diagram 700, data to decode is obtained. (Block 702) The data may be obtained from any suitable source, such as, but not limited to, a flash memory, magnetic hard drive, and data transmission. The data can be processed in any suitable manner prior to decoding. A local decoding iteration is performed on the data in a low density parity check decoder. (Block 704) In some embodiments, the low density parity check decoder is a layered decoder such as that disclosed in relation to FIG. 4. A determination is made as to whether the maximum number of iterations has been performed or whether the decoder converged. (Block 706) If not, another local decoding iteration is performed. (Block 704) If so, and if the decoder converged (Block 710), the hard decisions generated by the decoding are output. (Block 712) If the decoder did not converge, a determination is made as to whether the syndrome error is less than a threshold. (Block 714) If not, the data is identified as uncorrectable and the decoding is terminated. (Block 716) Otherwise, in some embodiments of a system supporting multiple bit map criteria, a determination is made as to whether a bit map criterion is selected which identifies variable nodes connected to at least two unsatisfied parity checks. (Block 720) If so, a bit map identifying variable nodes connected to at least two unsatisfied parity checks is generated and output. (Block 722) If not, a bit map identifying variable nodes connected to one unsatisfied parity check is generated and output. (Block 724)

Figure 8:
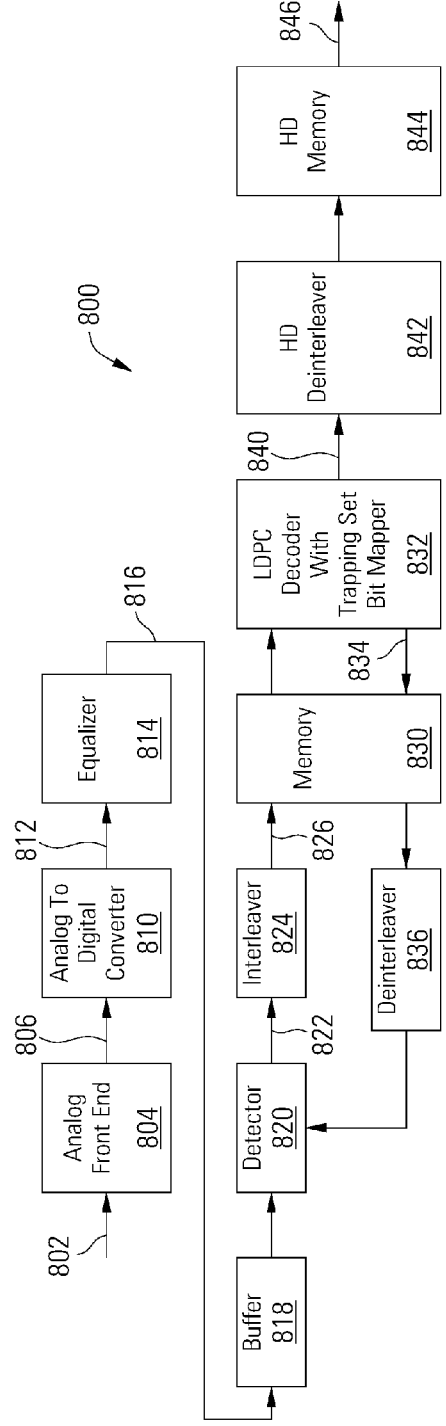
FIG. 8 depicts a block diagram of a read channel with a low density parity check decoder with bit mapping which may be used to retrieve or receive stored or transmitted data in accordance with some embodiments of the present invention.

Although the low density parity check decoder with bit mapping disclosed herein is not limited to any particular application, several examples of applications are presented herein that benefit from embodiments of the present invention. Turning to FIG. 8, a read channel 800 is used to process an analog signal 802 and to retrieve user data bits from the analog signal 802 without errors. In some cases, analog signal 802 is derived from a read/write head assembly in a magnetic storage medium. In other cases, analog signal 802 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 802 may be derived.

The read channel 800 includes an analog front end 804 that receives and processes the analog signal 802. Analog front end 804 may include, but is not limited to, an analog filter and an amplifier circuit as are known in the art. Based upon the disclosure provided herein, one of ordinary skill in the art will recognize a variety of circuitry that may be included as part of analog front end 804. In some cases, the gain of a variable gain amplifier included as part of analog front end 804 may be modifiable, and the cutoff frequency and boost of an analog filter included in analog front end 804 may be modifiable. Analog front end 804 receives and processes the analog signal 802, and provides a processed analog signal 806 to an analog to digital converter 810.

Analog to digital converter 810 converts processed analog signal 806 into a corresponding series of digital samples 812. Analog to digital converter 810 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. In other embodiments, digital data is retrieved directly from a storage device or other source, such as a flash memory. Digital samples 812 are provided to an equalizer 814. Equalizer 814 applies an equalization algorithm to digital samples 812 to yield an equalized output 816. In some embodiments of the present invention, equalizer 814 is a digital finite impulse response filter circuit as is known in the art. Data or codewords contained in equalized output 816 may be stored in a buffer 818 until a data detector 820 is available for processing.

The data detector 820 performs a data detection process on the received input, resulting in a detected output 822. In some embodiments of the present invention, data detector 820 is a Viterbi algorithm data detector circuit, or more particularly in some cases, a maximum a posteriori (MAP) data detector circuit as is known in the art. In these embodiments, the detected output 822 contains log likelihood ratio information about the likelihood that each bit or symbol has a particular value. Based upon the disclosure provided herein, one of ordinary skill in the art will recognize a variety of data detectors that may be used in relation to different embodiments of the present invention. Data detector 820 is started based upon availability of a data set in buffer 818 from equalizer 814 or another source.

The detected output 822 from data detector 820 is provided to an interleaver 824 that protects data against burst errors. Burst errors overwrite localized groups or bunches of bits. Because low density parity check decoders are best suited to correcting errors that are more uniformly distributed, burst errors can overwhelm low density parity check decoders. The interleaver 824 prevents this by interleaving or shuffling the detected output 822 from data detector 820 to yield an interleaved output 826 which is stored in a memory 830. The interleaved output 826 from the memory 830 is provided to a layered low density parity check decoder with bit mapper 832 which performs parity checks on the interleaved output 826, ensuring that parity constraints established by a low density parity check encoder (not shown) before storage or transmission are satisfied in order to detect and correct any errors that may have occurred in the data during storage or transmission.

Multiple detection and decoding iterations may be performed in the read channel 800, referred to herein as global iterations. (In contrast, local iterations are decoding iterations performed within the low density parity check decoder 832.) To perform a global iteration, log likelihood ratio values 834 from the low density parity check decoder 832 are stored in memory 830, deinterleaved in a deinterleaver 836 to reverse the process applied by interleaver 824, and provided again to the data detector 820 to allow the data detector 820 to repeat the data detection process, aided by the log likelihood ratio values 834 from the low density parity check decoder 832. In this manner, the read channel 800 can perform multiple global iterations, allowing the data detector 820 and low density parity check decoder 832 to converge on the correct data values.

The low density parity check decoder 832 also produces hard decisions 840 about the values of the data bits or symbols contained in the interleaved output 826 of the interleaver 824. For binary data bits, the hard decisions may be represented as 0's and 1's. In a GF(4) low density parity check decoder, the hard decisions may be represented by four field elements 00, 01, 10 and 11.

The hard decisions 840 from low density parity check decoder 832 are deinterleaved in a hard decision deinterleaver 842, reversing the process applied in interleaver 824, and stored in a hard decision memory 844 before being provided to a user or further processed. For example, the output 846 of the read channel 800 may be further processed to reverse formatting changes applied before storing data in a magnetic storage medium or transmitting the data across a transmission channel.

Figure 9:
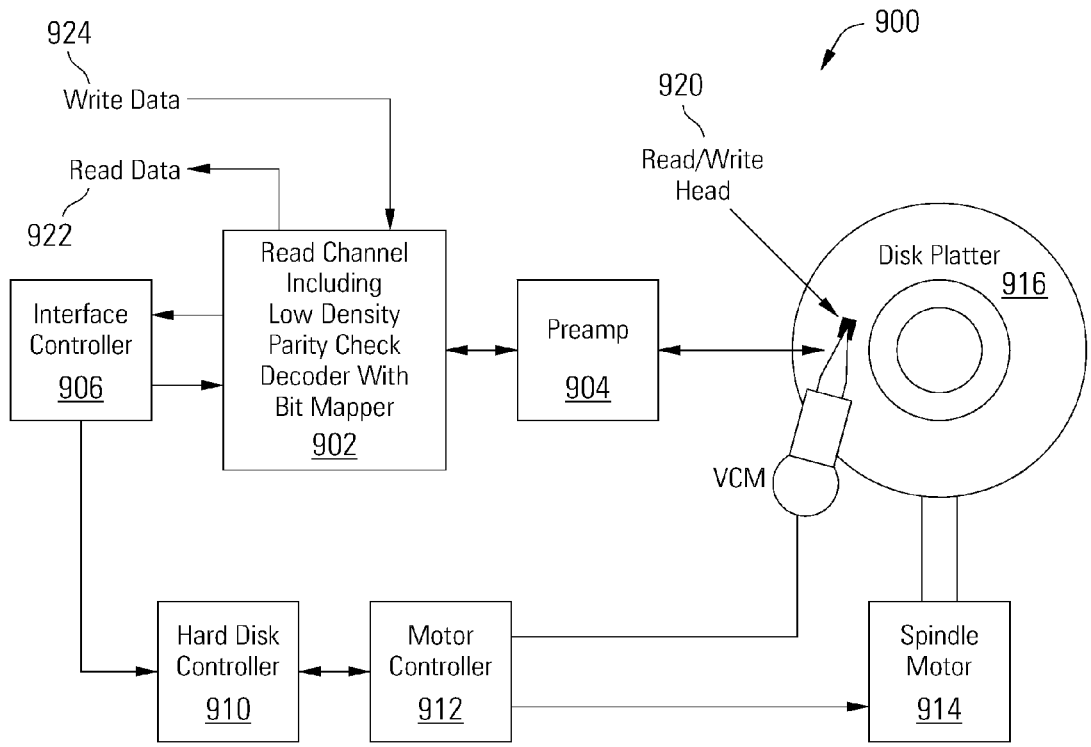
FIG. 9 depicts a storage system including a low density parity check decoder with bit mapping in accordance with some embodiments of the present invention.

Turning to FIG. 9, a storage system 900 is illustrated as an example application of a low density parity check decoder with bit mapping in accordance with some embodiments of the present invention. The storage system 900 includes a read channel circuit 902 with a low density parity check decoder with bit mapping in accordance with some embodiments of the present invention. Storage system 900 may be, for example, a hard disk drive. Storage system 900 also includes a preamplifier 904, an interface controller 906, a hard disk controller 910, a motor controller 912, a spindle motor 914, a disk platter 916, and a read/write head assembly 920. Interface controller 906 controls addressing and timing of data to/from disk platter 916. The data on disk platter 916 consists of groups of magnetic signals that may be detected by read/write head assembly 920 when the assembly is properly positioned over disk platter 916. In one embodiment, disk platter 916 includes magnetic signals recorded in accordance with either a longitudinal or a perpendicular recording scheme.

In a typical read operation, read/write head assembly 920 is accurately positioned by motor controller 912 over a desired data track on disk platter 916. Motor controller 912 both positions read/write head assembly 920 in relation to disk platter 916 and drives spindle motor 914 by moving read/write head assembly 920 to the proper data track on disk platter 916 under the direction of hard disk controller 910. Spindle motor 914 spins disk platter 916 at a determined spin rate (RPMs). Once read/write head assembly 920 is positioned adjacent the proper data track, magnetic signals representing data on disk platter 916 are sensed by read/write head assembly 920 as disk platter 916 is rotated by spindle motor 914. The sensed magnetic signals are provided as a continuous, minute analog signal representative of the magnetic data on disk platter 916. This minute analog signal is transferred from read/write head assembly 920 to read channel circuit 902 via preamplifier 904. Preamplifier 904 is operable to amplify the minute analog signals accessed from disk platter 916. In turn, read channel circuit 902 decodes and digitizes the received analog signal to recreate the information originally written to disk platter 916. This data is provided as read data 922 to a receiving circuit. While processing the read data, read channel circuit 902 processes the received signal using a low density parity check decoder with bit mapping. Such a low density parity check decoder with bit mapping may be implemented consistent with the circuits and methods disclosed in FIGS. 3-7. A write operation is substantially the opposite of the preceding read operation with write data 924 being provided to read channel circuit 902. This data is then encoded and written to disk platter 916.

It should be noted that storage system 900 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 900, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 900 may be modified to include solid state memory that is used to store data in addition to the storage offered by disk platter 916. This solid state memory may be used in parallel to disk platter 916 to provide additional storage. In such a case, the solid state memory receives and provides information directly to read channel circuit 902. Alternatively, the solid state memory may be used as a cache where it offers faster access time than that offered by disk platter 916. In such a case, the solid state memory may be disposed between interface controller 906 and read channel circuit 902 where it operates as a pass through to disk platter 916 when requested data is not available in the solid state memory or when the solid state memory does not have sufficient storage to hold a newly written data set. Based upon the disclosure provided herein, one of ordinary skill in the art will recognize a variety of storage systems including both disk platter 916 and a solid state memory.

Figure 10:
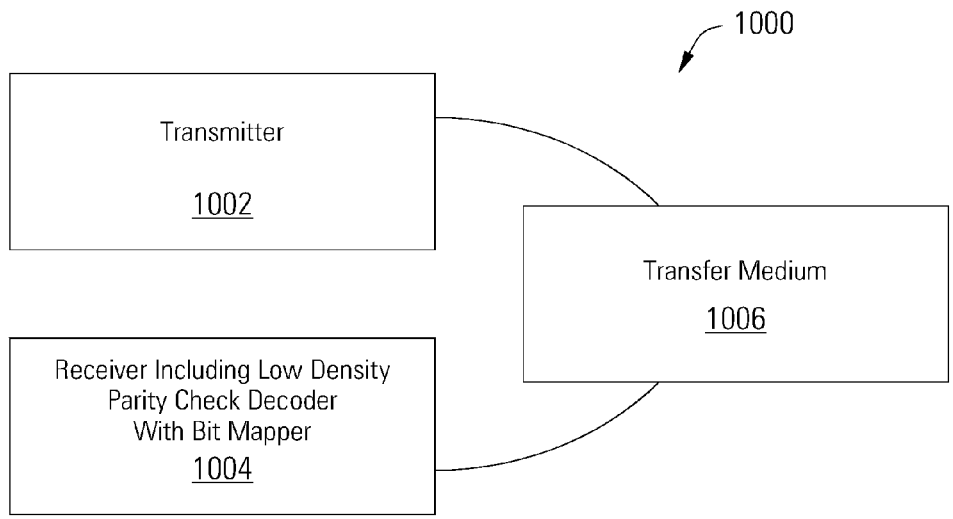
FIG. 10 depicts a wireless communication system including a low density parity check decoder with bit mapping in accordance with some embodiments of the present invention.

Turning to FIG. 10, a wireless communication system 1000 or data transmission device including a receiver 1004 with a low density parity check decoder with bit mapping is shown in accordance with some embodiments of the present invention. The transmitter 1002 is operable to transmit encoded information via a transfer medium 1006 as is known in the art. The encoded data is received from transfer medium 1006 by receiver 1004. Receiver 1004 incorporates a low density parity check decoder with bit mapping. Such a low density parity check decoder with bit mapping may be implemented consistent with the circuits and methods disclosed in FIGS. 3-7.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present invention provide novel systems, devices, methods and arrangements for a low density parity check decoder with bit mapping. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. A low density parity check decoder comprising:
a variable node processor operable to generate variable node to check node messages and to calculate perceived values based on check node to variable node messages;
a check node processor operable to generate check node to variable node message vectors and to calculate checksums based on the variable node to check node messages;
a convergence detector and bit map generator operable to detect convergence of the perceived values and to generate at least one bit map that identifies variable nodes that are connected to check nodes with unsatisfied parity checks, wherein the convergence detector and bit map generator comprises a plurality of barrel shifters;
wherein the convergence detector and bit map generator comprises a shift memory, a first set of multiplexors, and a plurality of subtractor circuits operable to configure the plurality of barrel shifters; and
an output selector circuit operable to receive the at least one bit map from the convergence detector and bit map generator, to receive hard decisions from a cyclic shifter, and to select between outputting the hard decisions and the at least one bit map.

2. The decoder of claim 1, wherein the plurality of barrel shifters are used both to detect the convergence and to generate the at least one bit map, a first bit map having a bit value of 1 indicating that a variable node corresponding to the first bit map is a candidate for bit flipping, and the first bit map having a bit value of 0 indicating the corresponding variable node is not a candidate for bit flipping.

3. The decoder of claim 1, wherein the convergence detector and bit map generator further comprises a second set of multiplexors operable to select signals derived from hard decisions or signals derived from syndromes.

4. The decoder of claim 1, wherein the first set of multiplexors are operable to select shift values during decoding iterations and to select reverse shift values when generating the at least one bit map.

5. The decoder of claim 2, wherein the convergence detector and bit map generator further comprises a circulant syndrome memory and a plurality of XOR gates operable to update the circulant syndrome memory during decoding iterations.

6. The decoder of claim 2, wherein the convergence detector and bit map generator further comprises a bit map logic circuit operable to assert bits in the at least one bit map when a particular number of parity checks associated with the bits are unsatisfied, as identified at outputs of the plurality of barrel shifters.

7. The decoder of claim 1, wherein the convergence detector and bit map generator is operable to calculate syndromes during decoding iterations and to generate the at least one bit map during a subsequent iteration.

8. The decoder of claim 7, wherein the variable node processor does not calculate the perceived values during the subsequent iteration.

9. The decoder of claim 1, wherein the decoder comprises a layered decoder, and wherein the convergence detector and bit map generator is operable to process data on a circulant by circulant basis.

10. The decoder of claim 1, wherein the convergence detector and bit map generator is operable to generate a plurality of bit maps with different selection criteria.

11. The decoder of claim 1, wherein the at least one bit map identifies variable nodes in a trapping set.

12. The decoder of claim 1, wherein the decoder is implemented as an integrated circuit.

13. The decoder of claim 1, wherein the decoder is incorporated in a storage device.

14. The decoder of claim 1, wherein the decoder is incorporated in a transmission system.

15. A method of making a low density parity check decoder, comprising:
providing a variable node processor operable to calculate perceived values based on parity checks;
providing a check node processor operable to perform the parity checks based on the perceived values;
providing a convergence detector and bit map generator operable to detect convergence of the perceived values for each of a plurality of decoding iterations and to generate at least one bit map that identifies variable nodes that are connected to check nodes with unsatisfied parity checks, wherein the convergence detector and bit map generator comprises a plurality of barrel shifters;
wherein the convergence detector and bit map generator comprises a shift memory, a first set of multiplexors, and a plurality of subtractor circuits operable to configure the plurality of barrel shifters; and
providing an output selector circuit operable to receive the at least one bit map from the convergence detector and bit map generator, to receive hard decisions from a cyclic shifter, and to select between outputting the hard decisions and the at least one bit map.

16. The method of claim 15, wherein providing the convergence detector and bit map generator comprises the first set of multiplexors to provide the plurality of barrel shifters with selectable inputs comprising hard decisions for use in the detecting convergence and syndromes for use in the generating of the at least one bit map.

17. The method of claim 15, further comprising providing a second set of multiplexors in the convergence detector and bit map generator operable to select between a plurality of bit maps with different selection criteria.

18. A storage system comprising:
a storage medium;
a head assembly disposed in relation to the storage medium and operable to provide a sensed signal corresponding to information on the storage medium;
an analog to digital converter circuit operable to sample an analog signal derived from the sensed signal to yield a series of digital samples; and
a low density parity check decoder operable to decode data in a signal derived from an output of the analog to digital converter circuit, comprising:
a variable node processor operable to generate variable node to check node messages and to calculate perceived values based on check node to variable node messages;
a check node processor operable to generate check node to variable node message vectors and to calculate checksums based on the variable node to check node messages;
a convergence detector and bit map generator operable to detect convergence of the perceived values and to generate at least one bit map that identifies variable nodes that are connected to check nodes with unsatisfied parity checks, wherein the convergence detector and bit map generator comprises a plurality of barrel shifters;

wherein the convergence detector and bit map generator comprises a shift memory, a first set of multiplexors, and a plurality of subtractor circuits operable to configure the plurality of barrel shifters; and an output selector circuit operable to receive the at least one bit map from the convergence detector and bit map generator, to receive hard decisions from a cyclic shifter, and to select between outputting the hard decisions and the at least one bit map.

* * * * *